(12) United States Patent
Matsuura et al.

(10) Patent No.: US 11,961,771 B2
(45) Date of Patent: Apr. 16, 2024

(54) LAMINATE SHEET AND METHOD OF USE THEREOF

(71) Applicant: MITSUI MINING & SMELTING CO., LTD., Tokyo (JP)

(72) Inventors: Yoshinori Matsuura, Ageo (JP); Takenori Yanai, Ageo (JP); Rintaro Ishii, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 450 days.

(21) Appl. No.: 17/349,320

(22) Filed: Jun. 16, 2021

(65) Prior Publication Data

US 2021/0313237 A1 Oct. 7, 2021

Related U.S. Application Data

(63) Continuation-in-part of application No. PCT/JP2019/032457, filed on Aug. 20, 2019.

(30) Foreign Application Priority Data

Dec. 18, 2018 (JP) .................................. 2018-236305

(51) Int. Cl.
  *G01R 31/12* (2020.01)
  *H01L 21/48* (2006.01)
  (Continued)

(52) U.S. Cl.
  CPC ............ *H01L 22/14* (2013.01); *G01R 31/129* (2013.01); *H01L 21/4857* (2013.01);
  (Continued)

(58) Field of Classification Search
  CPC ................. H01L 22/14; H01L 21/4857; H01L 23/49822; H01L 21/6835;
  (Continued)

(56) References Cited

U.S. PATENT DOCUMENTS 9,721,854 B2 * 8/2017 Ding ..................... H01L 22/34
2007/0242888 A1 * 10/2007 Renshaw ............. G06V 10/751
382/232
(Continued)

FOREIGN PATENT DOCUMENTS

JP 2005-101137 4/2005
JP 2007-242888 9/2007
(Continued)

OTHER PUBLICATIONS

ISR issued in WIPO Patent Application No. PCT/JP2019/032457, Oct. 29, 2019, English translation.

*Primary Examiner* — Tung X Nguyen
*Assistant Examiner* — Robert P Alejnikov, Jr.
(74) *Attorney, Agent, or Firm* — GREENBLUM & BERNSTEIN, P.L.C.

(57) ABSTRACT

There is provided a laminated sheet with which the electrical inspection of a redistribution layer formed later can be efficiently performed, while the laminated sheet is in the form of a sheet useful for the formation of a redistribution layer. This laminated sheet includes a carrier with a release function; a first electrically conductive film provided on the carrier with the release function; an insulating film provided on the first electrically conductive film; and a second electrically conductive film provided on the insulating film. The second electrically conductive film is used for formation of a redistribution layer, and the first electrically conductive film, the insulating film, and the second electrically conductive film function as a capacitor for performing electrical inspection of the redistribution layer.

15 Claims, 1 Drawing Sheet

(51) Int. Cl.
*H01L 21/66* (2006.01)
*H01L 23/498* (2006.01)
*H01L 21/683* (2006.01)

(52) U.S. Cl.
CPC .... *H01L 23/49822* (2013.01); *H01L 21/6835* (2013.01); *H01L 2221/68359* (2013.01)

(58) Field of Classification Search
CPC . H01L 2221/68359; H01L 2221/68345; H01L 23/14; G01R 31/129; B32B 7/06; B32B 15/08; H05K 1/16; H05K 3/00; H05K 1/162; H05K 3/007
USPC ......................................................... 324/554
See application file for complete search history.

(56) References Cited

U.S. PATENT DOCUMENTS

| 2012/0097944 | A1* | 4/2012 | Lin | H01L 25/0657 |
| | | | | 257/E23.002 |
| 2014/0054259 | A1* | 2/2014 | Tateoka | H05K 3/022 |
| | | | | 216/13 |
| 2019/0013212 | A1* | 1/2019 | Matsuura | B32B 15/04 |

FOREIGN PATENT DOCUMENTS

| JP | 2013-152109 | 8/2013 |
| JP | 2015-35551 | 2/2015 |
| TW | 201815953 | 5/2018 |
| WO | 2017/150283 | 9/2017 |
| WO | 2017/150284 | 9/2017 |

\* cited by examiner

LAMINATE SHEET AND METHOD OF USE THEREOF

CROSS-REFERENCE TO RELATED APPLICATIONS

This application is a continuation-in-part application of PCT/JP2019/032457 filed Aug. 20, 2019, which claims priority to Japanese Patent Application No. 2018-236305 filed Dec. 18, 2018, the entire contents all of which are incorporated herein by reference.

BACKGROUND OF THE INVENTION

1. Field of the Invention

The present invention relates to a laminated sheet and a method for using the same.

2. Description of the Related Art

In recent years, multilayering of printed wiring boards has been widely performed in order to increase the mounting density of the printed wiring boards for size reduction. Such multilayer printed wiring boards are utilized in many portable electronic apparatuses for the purpose of weight reduction and size reduction. Further reduction of the thicknesses of interlayer insulating layers, and still further weight reduction of wiring boards are required of these multilayer printed wiring boards.

As a technique for satisfying such requirements, a method for manufacturing a multilayer printed wiring board using a coreless build-up method is adopted. The coreless build-up method is a method of alternately laminating (building up) insulating layers and wiring layers for multilayering, without using a so-called core substrate. For the coreless build-up method, it is proposed to use a carrier-attached copper foil for easy release between a support and a multilayer printed wiring board. For example, Patent Literature 1 (JP2005-101137A) discloses a method for manufacturing a package substrate for semiconductor device mounting, including affixing an insulating resin layer to the carrier surface of a carrier-attached copper foil to form a support, forming a first wiring conductor on the superthin copper layer side of the carrier-attached copper foil by the steps of photoresist processing, pattern electrolytic copper plating, and resist removal, then forming build-up wiring layers, releasing the carrier-attached supporting substrate, and removing the superthin copper layer.

For the fining of embedded circuits as shown in Patent Literature 1, a carrier-attached copper foil in which the thickness of a superthin copper layer is 1 μm or less is desired. Accordingly, it is proposed to form a superthin copper layer by a vapor phase method such as sputtering in order to achieve the reduction of the thickness of the superthin copper layer. For example, Patent Literature 2 (WO2017/150283) discloses a carrier-attached copper foil in which a release layer, an antireflection layer, and a superthin copper layer (for example, film thickness 300 nm) are formed on a carrier such as a glass sheet by sputtering. Patent Literature 3 (WO2017/150284) discloses a carrier-attached copper foil in which intermediate layers (for example, an adhesion metal layer and a release-assisting layer), a release layer, and a superthin copper layer (for example, film thickness 300 nm) are formed on a carrier such as a glass sheet by sputtering. Patent Literatures 2 and 3 also teach that intermediate layers composed of predetermined metals are interposed to provide excellent stability of the mechanical release strength of the carrier, and that the antireflection layer exhibits a desirable dark color to improve visibility in image inspection (for example, automatic image inspection (AOI)).

Especially, with still further size reduction and power saving of electronic devices, the need for the high integration and thinning of semiconductor chips and printed wiring boards increases. As next-generation packaging techniques for satisfying such a need, the adoption of FO-WLP (Fan-Out Wafer Level Packaging) and PLP (Panel Level Packaging) has been studied in recent years. Also in FO-WLP and PLP, the adoption of the coreless build-up method is studied. One such method is a method referred to as an RDL-First (Redistribution Layer-First) method in which a wiring layer, and build-up wiring layers as needed, are formed on a coreless support surface, and further the support is released as needed, and then chips are mounted. For example, Patent Literature 4 (JP2015-35551A) discloses a method for manufacturing a semiconductor apparatus, including the formation of a metal release layer on a major surface of a support composed of glass or a silicon wafer, the formation of an insulating resin layer on the metal release layer, the formation of a redistribution layer including build-up layers on the insulating resin layer, the mounting and sealing of semiconductor integrated circuits on the redistribution layer, the exposure of the release layer by the removal of the support, the exposure of secondary mounting pads by the removal of the release layer, and the formation of solder bumps on the surfaces of the secondary mounting pads, and secondary mounting.

It is proposed to perform the electrical inspection of a product (including an intermediate product) having a plurality of wirings on a surface by impedance measurement. For example, Patent Literature 5 (JP2013-152109A) discloses an insulation inspection method in which the impedances between wirings are calculated using power at two or more different frequencies, and whether the insulation state between the wirings is good or not is determined by the amount of displacement according to the frequencies of the calculated two or more impedances. In other words, when the insulation state between wirings is good, an electrical signal influenced only by the capacitance between the wirings is detected, and when the insulation state between wirings is poor, an electrical signal influenced by the capacitance between the wirings and resistance (short circuit state) is detected. Therefore, it is considered that according to such a method, whether they are influenced by capacitance and resistance or not can be detected by calculating impedance values at a plurality of different frequencies.

CITATION LIST

Patent Literature

Patent Literature 1: JP2005-101137A
Patent Literature 2: WO2017/150283
Patent Literature 3: WO2017/150284
Patent Literature 4: JP2015-35551A
Patent Literature 5: JP2013-152109A

SUMMARY OF THE INVENTION

With further size and weight reduction of electronic apparatuses in recent years, it has been desired that a redistribution layer has a wiring pattern in which the line/space (L/S) is extremely highly fine. It is considered that in order to meet such a requirement, a redistribution layer is formed by the above-described build-up method or the like on a carrier-attached copper foil including a superthin copper layer with a reduced thickness, as shown in Patent Literatures 2 and 3. Particularly, a carrier-attached copper foil has the function of releasing the carrier and therefore has the advantage of being able to easily release the carrier that has served as a support from a laminate including a redistribution layer. On the other hand, due to such fining of a wiring pattern, it has been difficult to distinguish defective products by image inspection such as automatic image inspection (AOI). In this respect, it would be convenient if the inspection of a redistribution layer could be performed by electrical inspection, but such electrical inspection has been difficult with conventional carrier-attached copper foils.

The present inventors have now found that by providing, on a carrier with a release function, a layer configuration in which an insulating film is interposed between electrically conductive films, it is possible to make the layer configuration function as a capacitor so that the electrical inspection of a redistribution layer formed later can be efficiently performed, while the sheet is in the form of a laminated sheet useful for the formation of a redistribution layer.

Therefore, it is an object of the present invention to provide a laminated sheet with which the electrical inspection of a redistribution layer formed later can be efficiently performed, while the laminated sheet is in the form of a sheet useful for the formation of a redistribution layer.

According to an aspect of the present invention, there is provided a laminated sheet comprising:
a carrier with a release function;
a first electrically conductive film provided on the carrier with the release function;
an insulating film provided on the first electrically conductive film; and
a second electrically conductive film provided on the insulating film, wherein the second electrically conductive film is used for formation of a redistribution layer, and the first electrically conductive film, the insulating film, and the second electrically conductive film function as a capacitor for performing electrical inspection of the redistribution layer.

According to another aspect of the present invention, there is provided a method for using a laminated sheet, comprising the steps of:
processing the second electrically conductive film of the laminated sheet to form a redistribution layer, or forming a redistribution layer on the second electrically conductive film; and
performing electrical inspection on the redistribution layer, wherein the electrical inspection is performed by applying a voltage between the redistribution layer and the first electrically conductive film to allow the first electrically conductive film, the insulating film, and the second electrically conductive film to function as a capacitor, and measuring electrical characteristics.

According to another aspect of the present invention, there is provided a method for manufacturing a semiconductor package, comprising the steps according to the method for using the laminated sheet.

DETAILED DESCRIPTION OF THE INVENTION

Laminated Sheet

Figure 1:
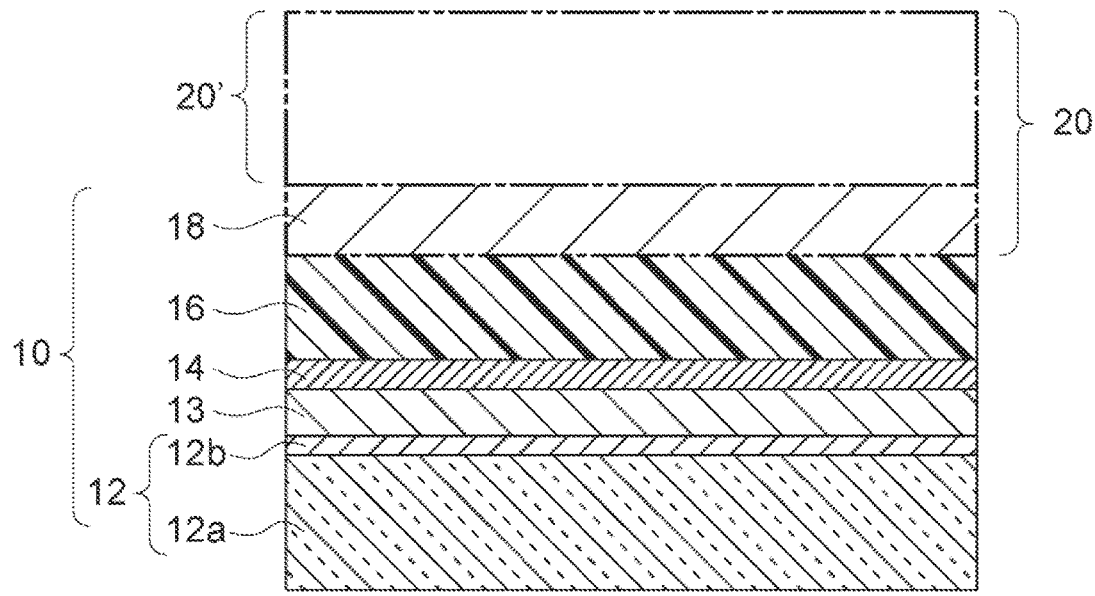
FIG. 1 is a cross-sectional schematic view showing one aspect of the laminated sheet of the present invention.

The laminated sheet of the present invention is schematically shown in FIG. 1. As shown in FIG. 1, the laminated sheet 10 of the present invention includes a carrier with a release function 12, a first electrically conductive film 14, an insulating film 16, and a second electrically conductive film 18 in this order. The first electrically conductive film 14 is provided on the carrier with the release function 12. The insulating film 16 is provided on the first electrically conductive film 14. The second electrically conductive film 18 is provided on the insulating film 16 and used for the formation of a redistribution layer 20. The first electrically conductive film 14, the insulating film 16, and the second electrically conductive film 18 function as a capacitor for performing the electrical inspection of the redistribution layer 20. The laminated sheet 10 may have a functional layer 13 between the carrier with the release function 12 and the first electrically conductive film 14 as desired. The various layers may each be a single layer or composed of a plurality of layers. The laminated sheet 10 may include the various layers in order on both surfaces of the carrier with the release function 12 so as to be vertically symmetrical. By providing a layer configuration in which the insulating film 16 is interposed between the first electrically conductive film 14 and the second electrically conductive film 18 on the carrier with the release function 12, in this manner, it is possible to make the first electrically conductive film 14, the insulating film 16, and the second electrically conductive film 18 function as a capacitor, so that the electrical inspection of the redistribution layer 20 formed using the second electrically conductive film 18 can be efficiently performed, while the sheet is in the form of a laminated sheet useful for the formation of the redistribution layer 20.

In the present invention, a redistribution layer means a layer including an insulating layer and a wiring layer formed in the interior and/or on the surface of the insulating layer. For example, chip electrodes disposed on a semiconductor chip and terminals disposed on a printed wiring board at a larger pitch than the chip electrodes can be electrically connected via this redistribution layer. The formation of the redistribution layer 20 should be performed according to a known method and is not particularly limited. For example, the redistribution layer 20 can be formed by alternately laminating insulating layers and wiring layers for multilayering by the above-described build-up method.

As shown in FIG. 1, the carrier with the release function 12 preferably includes a carrier 12a and a release function film 12b provided on the first electrically conductive film 14 (the functional layer 13 when present) side of the carrier 12a. The release function film 12b is a layer that allows the release of the carrier 12a from the first electrically conductive film 14. In other words, the carrier 12a may constitute the carrier with the release function 12 alone by having a release function itself, but typically the release function is subsequently provided by providing the release function film 12b on the first electrically conductive film 14 side of the carrier 12a. In any case, in the laminated sheet 10, the carrier with the release function 12 is adopted, and therefore after the formation of the redistribution layer 20, the carrier that has served as a support can be easily released and removed from the redistribution layer 20. In the laminated sheet 10, an intermediate layer (not shown) may be present between the carrier 12a and the release function film 12b as desired.

The thickness of the entire laminated sheet 10 is not particularly limited but is preferably 500 µm or more and 3000 µm or less, more preferably 700 µm or more and 2500 µm or less, further preferably 900 µm or more and 2000 µm or less, and particularly preferably 1000 µm or more and 1700 µm or less. The size of the laminated sheet 10 is not particularly limited but is preferably 10 cm square or more, more preferably 20 cm square or more, and further preferably 25 cm square or more. The upper limit of the size of the laminated sheet 10 is not particularly limited, and an exemplary rough standard of the upper limit is 1000 cm square in the case of a sheet piece and width 1250 cm×length 3000 m in the case of a roll form. The above-described layers are preferably present throughout the above size of the laminated sheet 10. The laminated sheet 10 is in the form of a sheet that itself can be handled alone, before and after the formation of the redistribution layer.

The material of the carrier 12a may be any of glass, a ceramic, a resin, and a metal. The form of the carrier 12a may be any of a sheet, a film, a plate, and a foil. The carrier 12a may be a laminate of these sheets, films, plates, foils, and the like. For example, the carrier 12a may be one that can function as a support having rigidity, such as a glass plate, a ceramic plate, or a metal plate, or may be in the form of having no rigidity, such as a metal foil or a resin film. Preferred examples of the metal of the carrier 12a include copper, titanium, nickel, stainless steel, and aluminum. Preferred examples of the ceramic include alumina, zirconia, silicon nitride, aluminum nitride, and various other fine ceramics. Preferred examples of the resin include PET resins, PEN resins, aramid resins, polyimide resins, nylon resins, liquid crystal polymers, polyetheretherketone resins, polyamide resins, polyamide-imide resins, polyethersulfone resins, polyphenylene sulfide resins, PTFE resins, and ETFE resins. More preferably, the carrier 12a is a material having a coefficient of thermal expansion (CTE) of less than 25 ppm/K (typically 1.0 ppm/K or more and 23 ppm/K or less), in view of preventing the warpage of a coreless support accompanying heating when mounting electronic devices. Examples of such a material include various resins (particularly, low thermal expansion resins such as polyimide resins and liquid crystal polymers), glass, and ceramics as described above. In view of handling properties and ensuring flatness during chip mounting, the carrier 12a preferably has a Vickers hardness of 100 HV or more, more preferably 150 HV or more and 2500 HV or less. As a material satisfying these characteristics, the carrier 12a is preferably composed of a resin film, glass, or a ceramic, more preferably glass or a ceramic, and particularly preferably glass. For example, the carrier 12a is a glass sheet. When glass is used as the carrier 12a, advantages are that it is lightweight, has a low coefficient of thermal expansion, has high insulating properties, and is rigid and has a flat surface and therefore the surface of the second electrically conductive film 18 can be extremely smoothed. When the carrier is glass, advantages are that it has surface flatness (coplanarity) advantageous during electronic device mounting, that it has chemical resistance in desmear and various plating steps in the process for manufacturing the redistribution layer 20, and that a chemical separation method can be adopted during redistribution layer-attached laminate separation. Preferred examples of the glass constituting the carrier 12a include quartz glass, borosilicate glass, alkali-free glass, soda lime glass, aluminosilicate glass, and combinations thereof, and particularly preferably alkali-free glass. The alkali-free glass is glass containing substantially no alkali metals that includes silicon dioxide, aluminum oxide, boron oxide, and alkaline earth metal oxides such as calcium oxide and barium oxide as main components and further contains boric acid. An advantage of this alkali-free glass is that it has a low coefficient of thermal expansion in the range of 3 ppm/K or more and 5 ppm/K or less and is stable in a wide temperature zone of 0° C. to 350° C., and therefore when semiconductor chips are mounted as electronic devices, the warpage of the glass can be minimized. The thickness of the carrier is preferably 100 µm or more and 2000 µm or less, more preferably 300 µm or more and 1800 µm or less, and further preferably 400 µm or more and 1100 µm or less. When the thickness is within such a range, the thinning of the redistribution layer 20, and the reduction of warpage that occurs during electronic component mounting can be achieved while suitable strength that does not hinder handling is ensured.

The surface of the carrier 12a on the first electrically conductive film 14 side preferably has an arithmetic mean roughness Ra of 0.1 nm or more and 70 nm or less, more preferably 0.5 nm or more and 60 nm or less, further preferably 1.0 nm or more and 50 nm or less, particularly preferably 1.5 nm or more and 40 nm or less, and most preferably 2.0 nm or more and 30 nm or less as measured in accordance with JIS B 0601-2001 using a laser microscope. Smaller arithmetic mean roughness in this manner can provide desirably lower arithmetic mean roughness Ra on the surface of the second electrically conductive film 18 opposite to the insulating film 16 (the outside surface of the second electrically conductive film 18) and thus is suitable for forming a wiring pattern in which the line/space (L/S) is highly fine to the extent of 13 µm or less/13 µm or less (for example, 12 µm/12 µm to 2 µm/2 µm), in the redistribution layer 20 formed using the second electrically conductive film 18.

The intermediate layer provided between the carrier 12a and the release function film 12b as desired may have a one-layer configuration or a configuration of two or more layers. When the intermediate layer is composed of two or more layers, the intermediate layer includes a first intermediate layer provided directly on the carrier 12a, and a second intermediate layer provided adjacent to the release function film 12b of the first intermediate layer. The first intermediate layer is preferably a layer composed of at least one metal selected from the group consisting of Ti, Cr, Al, and Ni, in terms of ensuring adhesion to the carrier 12a. The first intermediate layer may be a pure metal or an alloy. The thickness of the first intermediate layer is preferably 5 nm or more and 500 nm or less, more preferably 10 nm or more and 300 nm or less, further preferably 18 nm or more and 200 nm or less, and particularly preferably 20 nm or more and 100 nm or less. The second intermediate layer is preferably a layer composed of Cu, in terms of controlling the release strength between the second intermediate layer and the release function film 12b at the desired value. The thickness of the second intermediate layer is preferably 5 nm or more and 500 nm or less, more preferably 10 nm or more and 400 nm or less, further preferably 15 nm or more and 300 nm or less, and particularly preferably 20 nm or more and 200 nm or less. Another interposed layer may be present between the first intermediate layer and the second intermediate layer, and examples of the constituent material of the interposed layer include alloys of at least one metal selected from the group consisting of Ti, Cr, Mo, Mn, W, and Ni and Cu. On the other hand, when the intermediate layer has a one-layer configuration, the first intermediate layer may be adopted as the intermediate layer as it is, or the first intermediate layer and the second intermediate layer may be replaced by one intermediate alloy layer. This intermediate alloy layer is preferably composed of a copper alloy in which the content of at least one metal selected from the group consisting of Ti, Cr, Mo, Mn, W, Al, and Ni is 1.0 at % or more, and the Cu content is 30 at % or more. The thickness of the intermediate alloy layer is preferably 5 nm or more and 500 nm or less, more preferably 10 nm or more and 400 nm or less, further preferably 15 nm or more and 300 nm or less, and particularly preferably 20 nm or more and 200 nm or less. The thicknesses of the layers described above are values measured by analyzing a layer cross section by a transmission electron microscope-energy dispersive X-ray spectrometer (TEM-EDX). The metal constituting the intermediate layer may include unavoidable impurities due to the raw material component, the film formation step, and the like. In the case of exposure to the air after the film formation of the intermediate layer, the presence of oxygen mixed due to the exposure is allowed, which is not particularly limited. The intermediate layer is preferably a layer formed by a vapor phase method such as sputtering. The intermediate layer may be manufactured by any method but is particularly preferably a layer formed by a magnetron sputtering method using a metal target, in terms of being able to improve the uniformity of film thickness distribution.

The release function film 12b provided as desired is a layer that allows or facilitates the release of the carrier 12a. The release function film 12b may be a layer which enables the release by a method of applying physical force or a layer which enables the release by a releasing method using laser (i.e., laser lift-off (LLO)). When the release function film 12b is composed of a material which enables the release by laser lift-off, the release function film 12b may be composed of a resin whose interfacial adhesion strength is reduced by laser irradiation after curing, or it may be a layer of silicon, silicon carbide, metal oxide or the like that can be modified by laser irradiation. The release function film 12b may be either of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides of at least one or more of Cu, Ti, Al, Nb, Zr, Cr, W, Ta, Co, Ag, Ni, In, Sn, Zn, Ga, and Mo, and a carbon layer. Among these, particularly, the release function film 12b is preferably a layer mainly including carbon, in terms of ease of release, film-forming properties, and the like, more preferably a layer mainly composed of carbon or a hydrocarbon, and is further preferably composed of amorphous carbon, a hard carbon film. In this case, the release function film 12b (that is, the carbon layer) preferably has a carbon concentration of 60 atomic % or more, more preferably 70 atomic % or more, further preferably 80 atomic % or more, and particularly preferably 85 atomic % or more as measured by XPS. The upper limit value of the carbon concentration is not particularly limited, and the carbon concentration may be 100 atomic % but is practically 98 atomic % or less. The release function film 12b (particularly the carbon layer) can include unavoidable impurities (for example, oxygen, carbon, and hydrogen derived from the surrounding environment such as the atmosphere). In the release function film 12b (particularly the carbon layer), metal atoms can be mixed due to the film formation method of the first electrically conductive film 14 or the like laminated later. Carbon has low interdiffusivity with the carrier and low reactivity, and even if the laminated sheet is subjected to pressing at a temperature of more than 300° C., the formation of metallic bonds between a copper foil layer and a bonding interface due to high temperature heating can be prevented to maintain a state in which the release and removal of the carrier is easy. This release function film 12b is also preferably a layer formed by a vapor phase method such as sputtering, in terms of suppressing excessive impurities in the amorphous carbon, and in terms of continuous productivity with the film formation of the intermediate layer, and the like. The thickness of the release function film 12b is preferably 1 nm or more and 20 nm or less, more preferably 1 nm or more and 10 nm or less. This thickness is a value measured by analyzing a layer cross section by a transmission electron microscope-energy dispersive X-ray spectrometer (TEM-EDX).

The functional layer 13 provided as desired is not particularly limited as long as it provides the desired function such as the function of controlling the release strength between the functional layer 13 and the carrier with the release function 12 at the desired value. The functional layer 13 is preferably a layer composed of at least one metal selected from the group consisting of Ti, Cu, Ni, Ta, W, Al, Co, Fe, Mo, Cr, Ag, and Si and may be a pure metal or an alloy. The metal constituting the functional layer 13 may include unavoidable impurities due to the raw material component, the film formation step, and the like. In the case of exposure to the air after the film formation of the functional layer 13, the presence of oxygen mixed due to the exposure is allowed, which is not particularly limited. The thickness of the functional layer 13 is preferably 10 nm or more and 500 nm or less, more preferably 30 nm or more and 300 nm or less, further preferably 50 nm or more and 250 nm or less, and particularly preferably 80 nm or more and 200 nm or less.

The first electrically conductive film 14 is a layer having electrical conductivity and corresponds to an electrode portion in a capacitor. The first electrically conductive film 14 is preferably a metal film or an electrically conductive polymer film in terms of providing the desired electrical conductivity. When the first electrically conductive film 14 is a metal film, the first electrically conductive film 14 preferably includes a metal composed of Al, Ag, Cu, Ni, Ti, Ta, Fe, Co, Mo, Mg, Mn, Zn, Cr, In, Sn, or a combination thereof (for example, an alloy or an intermetallic compound) and more preferably includes Cu, Ni, Ti, Ta, In, Sn, Mo, or a combination thereof, further preferably Cu, Ti, In, Sn, Mo, or a combination thereof, and particularly preferably Cu, Ti, Mo, or a combination thereof, in view of achieving excellent electrical conductivity and stability while reducing cost. On the other hand, when the first electrically conductive film is an electrically conductive polymer film, the first electrically conductive film 14 preferably includes a polythiophene-based polymer, a polyacetylene-based polymer, a polyaniline-based polymer, a polypyrrole-based polymer, or a combination thereof, more preferably a polythiophene-based polymer, a polyacetylene-based polymer, a polyaniline-based polymer, or a combination thereof, further preferably a polythiophene-based polymer, a polyacetylene-based polymer, or a combination thereof, and particularly preferably a polythiophene-based polymer. The thickness of the first electrically conductive film 14 is preferably 5 nm or more and 1000 nm or less, more preferably 10 nm or more and 800 nm or less, further preferably 12 nm or more and 500 nm or less, and particularly preferably 15 nm or more and 400 nm or less. This thickness is a value measured by analyzing a layer cross section by a transmission electron microscope-energy dispersive X-ray spectrometer (TEM-EDX). The first electrically conductive film 14 is preferably a layer formed by a vapor phase method such as sputtering, in terms of being able to improve the uniformity of film thickness distribution, and in terms of continuous productivity with the film formation of other layers, and the like.

The insulating film 16 is a layer having insulating properties and corresponds to an insulator (dielectric) portion in a capacitor. The insulating film 16 is preferably an oxide film, a nitride film, a carbide film, a fluoride film, an insulating resin film (for example, an epoxy resin film, a polyimide resin film, an ethylene resin film, a phenolic resin film, a polypropylene terephthalate (PPT) resin film, an acrylonitrile-butadiene-styrene copolymerized (ABS) resin film, a nylon resin film, or a polybutylene terephthalate (PBT) resin film), or a combination thereof, more preferably an oxide film, a nitride film, a carbide film, a fluoride film, an epoxy resin film, a polyimide resin film, an ethylene resin film, a phenolic resin film, a polypropylene terephthalate (PPT) resin film, an acrylonitrile-butadiene-styrene copolymerized (ABS) resin film, a nylon resin film, a polybutylene terephthalate (PBT) resin film, or a combination thereof, further preferably an oxide film, a nitride film, a carbide film, a fluoride film, an epoxy resin film, a polyimide resin film, an ethylene resin film, a phenolic resin film, a polypropylene terephthalate (PPT) resin film, an acrylonitrile-butadiene-styrene copolymerized (ABS) resin film, or a combination thereof, and particularly preferably an oxide film, a nitride film, a carbide film, a fluoride film, an epoxy resin film, a polyimide resin film, an ethylene resin film, a phenolic resin film, or a combination thereof in view of ensuring adhesion to the first electrically conductive film 14 and adhesion to the second electrically conductive film 18. Examples of a preferred oxide film include a $SiO_x$ film, an $AlO_x$ film, a $TiO_x$ film, a $ZrO_x$ film, a $NbO_x$ film, and a $TaO_x$ film, and particularly preferably a $SiO_x$ film, an $AlO_x$ film, and a $TaO_x$ film. Examples of a preferred nitride film include a $SiN_x$ film, an $AlN_x$ film, a $TiN_x$ film, a $ZrN_x$ film, a $NbN_x$ film, a $TaN_x$ film, a $CrN_x$ film, and a $VN_x$ film, and particularly preferably a $SiN_x$ film, an $AlN_x$ film, and a $TiN_x$ film. Examples of a preferred carbide film include a TiC film, a ZrC film, a VC film, a MoC film, a NbC film, a TaC film, a NiC film, and a CrC film, and particularly preferably a TiC film, a ZrC film, and a MoC film. Examples of a preferred fluoride film include a $CaF_x$ film, a $AgF_x$ film, a $CoF_x$ film, and a $NiF_x$ film, and particularly preferably a $CaF_x$ film and a $NiF_x$ film. In view of improving the capacitance of the capacitor, the dielectric constant (relative dielectric constant) of the insulating film 16 is preferably 2 or more, more preferably 2.5 or more, further preferably 3.5 or more, and particularly preferably 4.0 or more at a frequency of 1 MHz. The upper limit value of the dielectric constant is not particularly limited, but the dielectric constant is typically 100 or less, more typically 50 or less. The thickness of the insulating film 16 is preferably 0.1 µm or more and 10 µm or less, more preferably 0.3 µm or more and 8.0 µm or less, further preferably 0.5 µm or more and 5.0 µm or less, and particularly preferably 0.8 µm or more and 3.0 µm or less. This thickness is a value measured by analyzing a layer cross section by a transmission electron microscope-energy dispersive X-ray spectrometer (TEM-EDX). The withstand voltage strength of the insulating film 16 is preferably $1.0 \times 10^4$ V/cm or more, more preferably $2.0 \times 10^4$ V/cm more, further preferably $5.0 \times 10^4$ V/cm or more, and particularly preferably $1.0 \times 10^5$ V/cm or more. Thus, when the high voltage is applied, the breakage of the capacitor including the insulating film 16 can be effectively prevented or suppressed, and therefore electrical inspection can be more reliably performed. The insulating film 16 is preferably formed by a chemical vapor deposition (CVD) method, a sputtering method, a vapor deposition method, a slit coater method, a spin coater method, a spray method, or a combination thereof, and these film formation methods can be appropriately selected according to the material of the adopted insulating film 16.

The second electrically conductive film 18 is a layer having electrical conductivity and corresponds to an electrode portion in a capacitor. The second electrically conductive film 18 is used for the formation of the redistribution layer 20. Therefore, the second electrically conductive film 18 is preferably a seed layer for forming the redistribution layer 20. From this viewpoint, the second electrically conductive film 18 is preferably a metal film. In this case, the second electrically conductive film 18 preferably includes a metal composed of a transition element of group 4, 5, 6, 9, 10, or 11, Al, Fe, Mg, Mn, Zn, In, Sn, or a combination thereof (for example, an alloy or an intermetallic compound) and more preferably includes Al, Ag, Cu, Ni, Ti, Ta, Fe, Co, Mo, Mg, Mn, Zn, Cr, In, Sn, or a combination thereof, more preferably Al, Ag, Cu, Ni, Ti, Ta, Mo, Cr, In, Sn, or a combination thereof, further preferably Al, Ag, Cu, Ni, Ti, Ta, Mo, Cr, or a combination thereof, particularly preferably Cu, Ni, Ti, Mo, Cr, or a combination thereof, and most preferably Cu. The metal constituting the second electrically conductive film 18 may include unavoidable impurities due to the raw material component and the film formation step.

The second electrically conductive film 18 may be manufactured by any method and may be a layer formed, for example, by wet film formation methods such as an electroless plating method and an electrolytic plating method, physical vapor deposition (PVD) methods such as sputtering and vacuum deposition, chemical vapor film formation, or combinations thereof. A particularly preferred second electrically conductive film 18 is a layer formed by physical vapor deposition (PVD) methods such as a sputtering method and vacuum deposition, most preferably a layer manufactured by a sputtering method, in view of easily meeting a fine pitch due to super-thinning. The second electrically conductive film 18 is preferably an unroughened layer but may be a layer in which secondary roughening occurs by preliminary roughening, soft etching treatment, rinse treatment, or oxidation-reduction treatment, as long as wiring pattern formation during redistribution layer 20 manufacture is not hindered. The thickness of the second electrically conductive film 18 is not particularly limited but is preferably 10 nm or more and 1000 nm or less, more preferably 20 nm or more and 900 nm or less, further preferably 30 nm or more and 700 nm or less, particularly preferably 50 nm or more and 600 nm or less, particularly more preferably 70 nm or more and 500 nm or less, and most preferably 100 nm or more and 400 nm or less in order to meet a fine pitch as described above. This thickness is a value measured by analyzing a layer cross section by a transmission electron microscope-energy dispersive X-ray spectrometer (TEM-EDX). The second electrically conductive film having a thickness within such a range is preferably manufactured by a sputtering method in view of the in-plane uniformity of film formation thickness, and productivity in a sheet form or a roll form.

The surface of the second electrically conductive film 18 opposite to the insulating film 16 (the outside surface of the second electrically conductive film 18) preferably has an arithmetic mean roughness Ra of 1.0 nm or more and 100 nm or less, more preferably 2.0 nm or more and 40 nm or less, further preferably 3.0 nm or more and 35 nm or less, particularly preferably 4.0 nm or more and 30 nm or less, and most preferably 5.0 nm or more and 15 nm or less as measured in accordance with JIS B 0601-2001 using a laser microscope. Smaller arithmetic mean roughness in this manner is suitable for forming a wiring pattern in which the line/space (L/S) is highly fine to the extent of 13 μm or less/13 μm or less (for example, 12 μm/12 μm to 2 μm/2 μm), in the redistribution layer 20 manufactured using the laminated sheet 10.

It is preferred that each of the first electrically conductive film 14 and the second electrically conductive film 18 be composed of at least one metal selected from the group consisting of Al, Ag, Cu, Ni, Ti, Ta, Fe, Co, Mo, Mg, Mn, Zn, Cr, In, and Sn, and the insulating film 16 be at least one selected from the group consisting of an oxide film, a nitride film, an epoxy resin film, and a polyimide resin film. More preferably, each of the first electrically conductive film 14 and the second electrically conductive film 18 is composed of at least one metal selected from the group consisting of Al, Cu, Ti, and Mo, and the insulating film 16 is at least one selected from the group consisting of an oxide film, an epoxy resin film, and a polyimide resin film. As described above, the first electrically conductive film 14, the insulating film 16, and the second electrically conductive film 18 are layers that function as a capacitor for performing the electrical inspection of the redistribution layer 20, and more preferred properties (for example, capacitance and withstand voltage strength) for performing electrical inspection can be provided to the capacitor by the above combination.

Method for Manufacturing Laminated Sheet

The laminated sheet 10 according to the present invention can be manufactured by providing the carrier 12a and forming an intermediate layer (for example, a first intermediate layer and a second intermediate layer) as desired, the release function film 12b as desired, the functional layer 13 as desired, the first electrically conductive film 14, the insulating film 16, and the second electrically conductive film 18 on the carrier 12a. The formation of each layer of the intermediate layer (when present), the release function film 12b (when present), the functional layer 13 (when present), the first electrically conductive film 14, and the second electrically conductive film 18 is preferably performed by a physical vapor deposition (PVD) method in view of easily meeting a fine pitch due to super-thinning. Examples of the physical vapor deposition (PVD) method include a sputtering method, a vacuum deposition method, and an ion plating method, and most preferably a sputtering method in terms of being able to control film thickness in a wide range such as 0.05 nm to 5000 nm, and in terms of being able to ensure film thickness uniformity over a wide width or area, and the like. The film formation by the physical vapor deposition (PVD) method should be performed according to known conditions using a known vapor phase film formation apparatus, and is not particularly limited. For example, when the sputtering method is adopted, the sputtering method may include various known methods such as magnetron sputtering, a bipolar sputtering method, and a facing target sputtering method, but magnetron sputtering is preferred in terms of a fast film formation rate and high productivity. The sputtering may be performed with either of DC (direct current) and RF (radio frequency) power supplies. Also for the target shape, a widely known plate type target can be used, but a cylindrical target is desirably used in view of target use efficiency. On the other hand, the formation of the insulating film 16 is preferably performed by a chemical vapor deposition (CVD) method, a sputtering method, a vapor deposition method, a slit coater method, a spin coater method, a spray method, or a combination thereof. In this respect, by forming all layers of the intermediate layer (when present), the release function film 12b (when present), the functional layer 13 (when present), the first electrically conductive film 14, the insulating film 16, and the second electrically conductive film 18 by the sputtering method, the manufacturing efficiency increases significantly. The film formation of each layer of the intermediate layer (when present), the release function film 12b (when present), the functional layer 13 (when present), the first electrically conductive film 14, and the second electrically conductive film 18 by a vapor phase method (preferably a sputtering method), and the film formation of the insulating film 16 by the above method will be described below.

When the intermediate layer has a two-layer configuration of a first intermediate layer and a second intermediate layer, the film formation of the first intermediate layer by a vapor phase method is preferably performed by magnetron sputtering under a non-oxidizing atmosphere using a target composed of at least one metal selected from the group consisting of Ti, Cr, Al, and Ni, in terms of being able to improve film thickness distribution uniformity. The purity of the target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. In view of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the second intermediate layer by a vapor phase method is preferably performed by magnetron sputtering under a non-oxidizing atmosphere using a copper target, in terms of being able to improve film thickness distribution uniformity. The purity of the copper target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. In view of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

When the intermediate layer is an intermediate alloy layer, the intermediate layer is preferably performed by magnetron sputtering under a non-oxidizing atmosphere using an alloy target of at least one metal selected from the group consisting of Ti, Cr, Mo, Mn, W, Al, and Ni and Cu, in terms of being able to improve film thickness distribution uniformity. The purity of the copper target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. In view of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the release function film 12b by a vapor phase method is preferably performed under an inert atmosphere such as argon using a carbon target. The carbon target is preferably composed of graphite but can include unavoidable impurities (for example, oxygen and carbon derived from the surrounding environment such as the atmosphere). The purity of the carbon target is preferably 99.99 wt % or more, more preferably 99.999 wt % or more. In view of continuously performing film formation without poor operation such as abnormal discharge and poor plasma irradiation, the pressure during the film formation is preferably in the range of 0.1 Pa or more and 2.0 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the first electrically conductive film 14 and the second electrically conductive film 18 by a vapor phase method is preferably performed by magnetron sputtering under a non-oxidizing atmosphere using a target composed of at least one metal selected from the group consisting of Al, Ag, Cu, Ni, Ti, Ta, Fe, Co, Mo, Mg, Mn, Zn, Cr, In, and Sn, in terms of being able to improve film thickness distribution uniformity. The purity of the target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. In order to avoid temperature increase during the vapor phase film formation of the first electrically conductive film 14 and the second electrically conductive film 18, the cooling mechanism of the stage may be provided in sputtering. In view of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the insulating film 16 is preferably performed by a chemical vapor deposition (CVD) method, a sputtering method, a vapor deposition method, a slit coater method, a spin coater method, or a spray method using at least one selected from the group consisting of an oxide, a nitride, a carbide, a fluoride, an epoxy resin, a polyimide resin, an ethylene resin, a phenolic resin, a PPT resin, an ABS resin, a nylon resin, and a PBT resin, and these film formation methods should be appropriately selected according to the material of the adopted insulating film 16. The conditions of the film formation methods are not particularly limited, and known conditions may be adopted as they are, or known conditions may be appropriately adjusted according to the material of the insulating film 16.

Method for Using Laminated Sheet

The redistribution layer 20 can be manufactured using the laminated sheet 10 of the present invention. The first electrically conductive film 14, the insulating film 16, and the second electrically conductive film 18 function as a capacitor, and thus the electrical inspection of the manufactured redistribution layer 20 can be efficiently performed. A preferred method for using the laminated sheet 10 according to the present invention will be described below. This method for using the laminated sheet 10 includes (1) a redistribution layer formation step and (2) a redistribution layer electrical inspection step.

(1) Redistribution Layer Formation Step

The redistribution layer 20 is formed using the laminated sheet 10 of the present invention. The formation of the redistribution layer 20 can be performed by processing the second electrically conductive film 18. In this case, the second electrically conductive film 18 is included in part of the redistribution layer 20. Alternatively, a redistribution layer 20' may be formed on the second electrically conductive film 18 without the second electrically conductive film 18 itself being subjected to processing. In this respect, the redistribution layer 20' can be formed, for example, by laminating a further metal layer (for example, copper layer) on the second electrically conductive film 18 and processing the metal layer. In this case, the second electrically conductive film 18 itself does not constitute the redistribution layer 20', and therefore the second electrically conductive film 18 is preferably removed by flash etching or the like after the carrier with the release function 12 is released.

The method for forming the redistribution layer 20 is not particularly limited, and, for example, the known methods shown in Patent Literature 2 to Patent Literature 4 can be adopted. One example of the method for forming the redistribution layer 20 using the laminated sheet 10 of the present invention will be described below. First, a photoresist layer is formed on the surface of the second electrically conductive film 18 in the laminated sheet 10 in a predetermined pattern. The photoresist is preferably a photosensitive film, for example, a photosensitive dry film. In the photoresist layer, a predetermined wiring pattern should be provided by exposure and development. An electric copper plating layer is formed on the exposed surface (that is, the portions not masked with the photoresist layer) of the second electrically conductive film 18. The electric copper plating should be performed by a known method and is not particularly limited. Then, the photoresist layer is stripped. As a result, the electric copper plating layer remains in the wiring pattern form, and the second electrically conductive film 18 in the portions not forming the wiring pattern is exposed. These unnecessary portions of the second electrically conductive film 18 are removed by flash etching to form a first wiring layer. Subsequently, an insulating layer and an nth wiring layer (n is an integer of 2 or more) are alternately formed on the surface of the laminated sheet 10 on which the first wiring layer is formed. Thus, a coreless support in which the redistribution layer 20, a layer including insulating layers and wiring layers formed in the interiors and/or on the surfaces of the insulating layers, is formed can be obtained.

(2) Redistribution Layer Electrical Inspection Step

Figure 2:
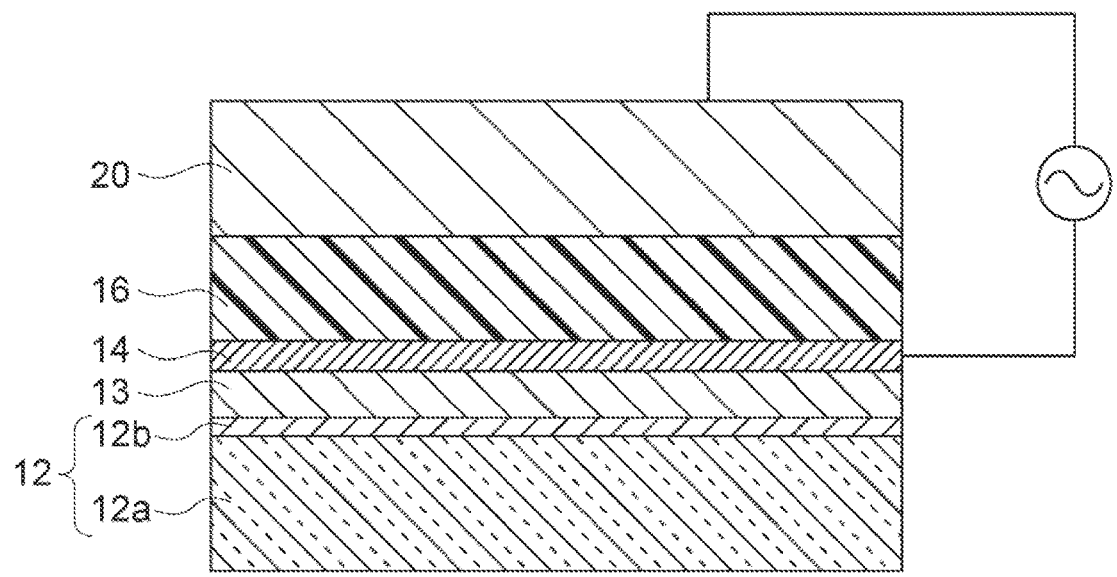
FIG. 2 is a cross-sectional schematic view showing one example of the electrical inspection of a redistribution layer.

Electrical inspection is performed on the redistribution layer 20 formed using the second electrically conductive film 18. This electrical inspection should be performed by applying a voltage between the redistribution layer 20 and the first electrically conductive film 14 to allow the first electrically conductive film 14, the insulating film 16, and the second electrically conductive film 18 to function as a capacitor, and measuring electrical characteristics (mainly impedance or capacitance), as shown in FIG. 2. More specifically, for example, based on a known method as shown in Patent Literature 5, the impedances between the wirings are measured using power at two or more different frequencies, and whether the insulation state between the wirings is good or not can be determined by the amount of displacement according to the frequencies of the calculated two or more impedances. When the electrical characteristics (mainly impedance or capacitance) are measured by allowing an electrical inspection probe to abut the first electrically conductive film 14, or the like, the carrier with the release function 12 may be previously released and removed from the redistribution layer 20 as needed, in order to expose the first electrically conductive film 14.

After the electrical inspection, the step of mounting electronic devices such as chips on the redistribution layer 20 is preferably performed as needed, to manufacture semiconductor packages. The first electrically conductive film 14 and the insulating film 16 may be removed by a known method. As described above, the process of forming the redistribution layer 20 and then mounting chips in this manner is a method referred to as an RDL-First method. According to this method, the electrical inspection of the wiring layer and the subsequently laminated build-up wiring layers on the coreless support surface can be performed before chips are mounted, and therefore the chips can be mounted only on good product portions, avoiding the defective portions of the wiring layers. As a result, the RDL-First method is economically advantageous compared with a Chip-First method, a method of sequentially laminating wiring layers on the surfaces of chips, and the like, in terms of being able to avoid waste of chips. At this time, the first electrically conductive film 14, the insulating film 16, and the second electrically conductive film 18 function as a capacitor, and therefore electrical inspection can be efficiently performed. Examples of the electronic devices mounted on the redistribution layer 20 assumed as an optional step include semiconductor devices, chip capacitors, and resistors. Examples of the electronic device mounting method include a flip chip mounting method and a die bonding method. The flip chip mounting method is a method of bonding the mounting pads of electronic devices and the redistribution layer 20. Columnar electrodes (pillars), solder bumps, or the like may be formed on these mounting pads, and before mounting, an NCF (Non-Conductive Film), which is a sealing resin film, or the like may be affixed to the redistribution layer 20 surface. The bonding is preferably performed using a low melting point metal such as solder, but an anisotropic conductive film or the like may be used. The die bonding adhesion method is a method of adhering the surfaces of electronic devices opposite to the mounting pad surfaces to the redistribution layer 20. For this adhesion, a paste or a film that is a resin composition including a thermosetting resin and a thermally conductive inorganic filler is preferably used.

What is claimed is:

1. A laminated sheet comprising:
a carrier with a release function;
a first electrically conductive film provided on the carrier with the release function;
an insulating film provided on the first electrically conductive film; and
a second electrically conductive film provided on the insulating film, wherein the second electrically conductive film is used for formation of a redistribution layer, and the first electrically conductive film, the insulating film, and the second electrically conductive film function as a capacitor for performing electrical inspection of the redistribution layer.

2. The laminated sheet according to claim 1, wherein the carrier with the release function comprises a carrier and a release function film provided on the first electrically conductive film side of the carrier and allowing release of the carrier from the first electrically conductive film.

3. The laminated sheet according to claim 1, wherein the first electrically conductive film is a metal film or an electrically conductive polymer film.

4. The laminated sheet according to claim 3, wherein the first electrically conductive film is a metal film comprising at least one metal selected from the group consisting of Al, Ag, Cu, Ni, Ti, Ta, Fe, Co, Mo, Mg, Mn, Zn, Cr, In, and Sn.

5. The laminated sheet according to claim 3, wherein the first electrically conductive film is an electrically conductive polymer film comprising at least one selected from the group consisting of a polythiophene-based polymer, a polyacetylene-based polymer, a polyaniline-based polymer, and a polypyrrole-based polymer.

6. The laminated sheet according to claim 1, wherein the first electrically conductive film has a thickness of 5 nm or more and 1000 nm or less.

7. The laminated sheet according to claim 1, wherein the second electrically conductive film is a seed layer for forming the redistribution layer.

8. The laminated sheet according to claim 1, wherein the second electrically conductive film is a metal film.

9. The laminated sheet according to claim 1, wherein the second electrically conductive film is a metal film comprising at least one metal selected from the group consisting of Al, Ag, Cu, Ni, Ti, Ta, Fe, Co, Mo, Mg, Mn, Zn, Cr, In, and Sn.

10. The laminated sheet according to claim 1, wherein the second electrically conductive film has a thickness of 10 nm or more and 1000 nm or less.

11. The laminated sheet according to claim 1, wherein the insulating film has a dielectric constant of 2 or more at a frequency of 1 MHz.

12. The laminated sheet according to claim 1, wherein the insulating film has a thickness of 0.1 μm or more and 10 μm or less.

13. The laminated sheet according to claim 1, wherein the insulating film has a withstand voltage strength of $1.0 \times 10^4$ V/cm or more.

14. The laminated sheet according to claim 1, wherein the insulating film is at least one selected from the group consisting of an oxide film, a nitride film, a carbide film, a fluoride film, an epoxy resin film, a polyimide resin film, an ethylene resin film, a phenolic resin film, a PPT resin film, an ABS resin film, a nylon resin film, and a PBT resin film.

15. The laminated sheet according to claim 1, wherein each of the first electrically conductive film and the second electrically conductive film is composed of at least one metal selected from the group consisting of Al, Ag, Cu, Ni, Ti, Ta, Fe, Co, Mo, Mg, Mn, Zn, Cr, In, and Sn, and the insulating film is at least one selected from the group consisting of an oxide film, a nitride film, an epoxy resin film, and a polyimide resin film.

* * * * *